(12) United States Patent
McCollum et al.

(10) Patent No.: US 7,245,535 B2
(45) Date of Patent: Jul. 17, 2007

(54) NON-VOLATILE PROGRAMMABLE MEMORY CELL FOR PROGRAMMABLE LOGIC ARRAY

(75) Inventors: John McCollum, Saratoga, CA (US); Hung-Sheng Chen, San Jose, CA (US); Frank Hawley, Campbell, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 11/233,396

(22) Filed: Sep. 21, 2005

(65) Prior Publication Data

US 2007/0064484 A1    Mar. 22, 2007

(51) Int. Cl.
*G11C 16/04*    (2006.01)
(52) U.S. Cl. .......................... 365/185.18; 365/185.05; 365/185.25
(58) Field of Classification Search ........... 365/185.18, 365/185.26, 185.33, 185.05, 185.25
See application file for complete search history.

(56) References Cited

U.S. PATENT DOCUMENTS

| | | | |
|---|---|---|---|
| 4,761,764 A * | 8/1988 | Watanabe .............. | 365/185.21 |
| 5,640,344 A | 6/1997 | Pani et al. | |
| 5,740,106 A | 4/1998 | Nazarian | |
| 5,847,993 A | 12/1998 | Dejenfelt | |
| 5,943,268 A * | 8/1999 | Nguyen .................. | 365/185.29 |
| 5,999,444 A * | 12/1999 | Fujiwara et al. ....... | 365/185.02 |
| 6,014,044 A * | 1/2000 | Kramer et al. ................ | 327/81 |
| 6,144,580 A | 11/2000 | Murray | |
| 6,356,478 B1 | 3/2002 | McCollum | |
| 6,445,631 B2 * | 9/2002 | Smith .......................... | 365/201 |
| 6,507,519 B1 * | 1/2003 | Collins et al. ......... | 365/185.28 |
| 7,031,189 B2 * | 4/2006 | Pascucci ................ | 365/185.08 |
| 7,129,748 B1 * | 10/2006 | McCollum et al. ........... | 326/40 |

* cited by examiner

*Primary Examiner*—Connie C. Yoha
(74) *Attorney, Agent, or Firm*—Sierra Patent Group, Ltd.

(57) ABSTRACT

A non-volatile programmable memory cell suitable for use in a programmable logic array includes a non-volatile MOS transistor of a first conductivity type in series with a volatile MOS transistor of a second conductivity type. The non-volatile MOS transistor may be a floating gate transistor, such as a flash transistor, or may be another type of non-volatile transistor such as a floating charge-trapping SONOS, MONOS transistor, or a nano-crystal transistor. A volatile MOS transistor, an inverter, or a buffer may be driven by coupling its gate or input to the common connection between the non-volatile MOS transistor and the volatile MOS transistor.

37 Claims, 3 Drawing Sheets

NON-VOLATILE PROGRAMMABLE MEMORY CELL FOR PROGRAMMABLE LOGIC ARRAY

BACKGROUND OF THE INVENTION

1. Field of the Invention

The present invention relates to non-volatile-memory based programmable logic devices. More particularly, the present invention pertains to memory cells for use in non-volatile-memory based programmable logic devices such as field-programmable-gate-array (FPGA) devices.

2. The Prior Art

Numerous non-volatile memory cells have been proposed for use in programmable logic devices such as FPGAs. As non-exhaustive examples, U.S. Pat. No. 6,144,580 discloses embodiments where p-channel and n-channel non-volatile MOS transistors are connected in series and have different control gate connection arrangements. U.S. Pat. No. 6,356,478 discloses p-channel and n-channel non-volatile MOS transistors sharing a common floating gate and a common control gate. U.S. Pat. No. 5,740,106 discloses several different variations on p-channel and n-channel non-volatile MOS transistors connected in series. Some share common floating gates. U.S. Pat. No. 5,847,993 discloses several different variations on p-channel and n-channel volatile and non-volatile MOS transistors connected in series. Some share common floating gates. U.S. Pat. No. 5,640,344 discloses p-channel and n-channel non-volatile MOS transistors sharing a common floating gate and a common control gate.

BRIEF DESCRIPTION OF THE INVENTION

A non-volatile programmable memory cell suitable for use in a programmable logic array includes a non-volatile MOS transistor in series with a volatile MOS transistor. The non-volatile MOS transistor may be a floating gate transistor, such as a flash transistor, or may be another type of non-volatile transistor such as a floating charge-trapping SONOS, MONOS transistor, or a nano-crystal transistor. A volatile MOS transistor, an inverter, or a buffer may be driven by coupling its gate or input to the common connection between the non-volatile MOS transistor and the volatile MOS transistor.

According to one aspect of the invention, a non-volatile n-channel MOS pulldown transistor is placed in series with a p-channel MOS pullup transistor. An n-channel MOS transistor has its gate coupled to the common connection between the non-volatile n-channel MOS pulldown transistor and the p-channel MOS pullup transistor. In a variation of this arrangement, an inverter or buffer may have its input coupled to the common connection between the non-volatile n-channel MOS pulldown transistor and the p-channel MOS pullup transistor.

According to another aspect of the invention, a non-volatile p-channel MOS pullup transistor is placed in series with a n-channel MOS pulldown transistor. An n-channel MOS transistor has its gate coupled to the common connection between the non-volatile p-channel MOS pullup transistor and the n-channel MOS pulldown transistor. In a variation of this arrangement, an inverter or buffer may have its input coupled to the common connection between the non-volatile p-channel MOS pullup transistor and the n-channel MOS pulldown transistor.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Referring first to FIGS. 1A through 1D, schematic diagrams show several versions of a non-volatile memory cell according to the present invention in which a non-volatile MOS pulldown transistor is used in conjunction with a volatile pullup transistor. The combination of the non-volatile device and the volatile device is used to drive a switch.

Figure 1A:
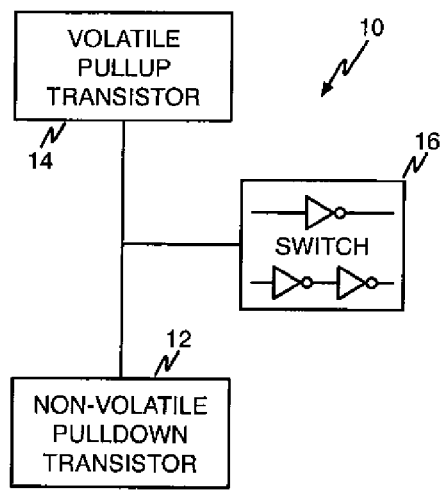
FIGS. 1A through 1D are schematic diagrams illustrating various non-volatile programmable memory cells using n-channel non-volatile MOS transistors, volatile p-channel MOS pullup transistors and n-channel transistors as switches.

First, in FIG. 1A, memory cell 10 is shown. Reference numeral 12 represents a non-volatile pulldown device, reference numeral 14 represents a volatile pullup device. Reference numeral 16 represents a switch controlled by the devices 12 and 14 that may be used to control circuitry or selectively make interconnects. As presently contemplated, switch 16 may comprise a single transistor, an inverter, a buffer (two inverters in series) or other device. Switch 16 may even be itself the input of a multiplexer.

Figure 1B:
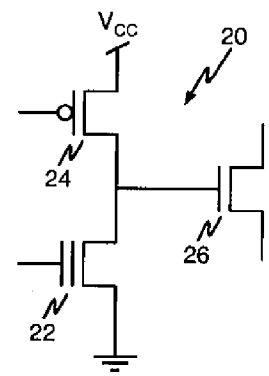

Referring now to FIG. 1B, memory cell 20 is shown. N-channel floating-gate MOS transistor 22 has its source coupled to ground and its drain coupled to the drain of p-channel MOS pullup transistor 24. The source of p-channel pullup transistor 24 is coupled to the supply potential $V_{cc}$. The common drain connection of transistors 22 and 24 is coupled to the gate of n-channel switch transistor 26. The source and drain of n-channel MOS switch transistor 26 may be connected to routing lines or logic circuits such as multiplexers, LUTs, etc. to provide programmable functions as will be disclosed herein.

N-channel floating-gate MOS transistor 22 may be a floating gate transistor such as an EEPROM transistor or a flash transistor as is known in the art. Its gate may be coupled to a circuit that provides the proper voltages for programming and erasing the memory cell 20, and also uses the memory cell 20 during normal circuit operation. The particular potentials used for these operations will vary as a function of the type of transistor technology employed and the process geometry.

Figure 1C:
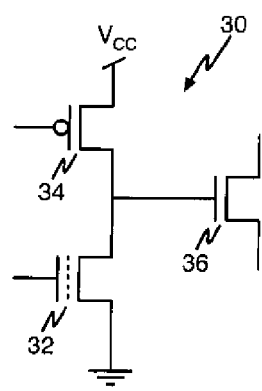

Referring now to FIG. 1C, another embodiment of the programmable cell of the present invention is shown as memory cell 30. N-channel floating charge-trap MOS transistor 32 has its source coupled to ground and its drain coupled to the drain of p-channel MOS pullup transistor 34. The source of p-channel pullup transistor 34 is coupled to the supply potential $V_{cc}$. The common drain connection of transistors 32 and 34 is coupled to the gate of n-channel switch transistor 36. The source and drain of n-channel MOS switch transistor 36 may be connected to provide programmable functions as will be disclosed herein.

N-channel floating charge-trap MOS transistor 32 may be fabricated using MNOS, SONOS, and other charge-trapping structures. Its gate, source, and drain may be coupled to a circuit to provide the proper voltages for programming and erasing the memory cell 30, and for using the memory cell 30 during normal circuit operation. The particular potentials used for these operations will vary as a function of the type of transistor technology employed and the process geometry. As an example, where a high-voltage p-channel MOS pullup transistor 34 is used, the following illustrative potentials may be applied for program, erase, and normal operation of the cell:

|  | N-Channel | | | P-Channel | | |
|---|---|---|---|---|---|---|
|  | $V_G$ | $V_S$ | $V_{p\text{-well}}$ | $V_G$ | $V_S$ | $V_{n\text{-well}}$ |
| Program | 7 V | 3.5 V | 0 V | −1.5 V | ~0 V | 3.3 V |
| Erase | −9 V | 5 V | 5 V | 5 V | 5 V | 5 V |
| Normal Operation | ~2 V | 0 V | 0 V | ~3.1 V | 3.3 V | 3.3 V |

Discrete charge trapping devices are less vulnerable to tunnel oxide defects than are floating gate devices and their use may be preferable because of this characteristic.

Figure 1D:
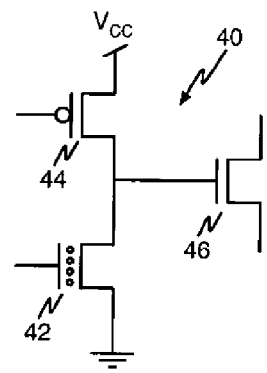

Referring now to FIG. 1D, another embodiment of the programmable cell of the present invention is shown as memory cell 40. N-channel nano-crystal MOS transistor 42 has its source coupled to ground and its drain coupled to the drain of p-channel MOS pullup transistor 44. The source of p-channel pullup transistor 44 is coupled to the supply potential $V_{cc}$. The common drain connection of transistors 42 and 44 is coupled to the gate of n-channel switch transistor 46. The source and drain of n-channel MOS switch transistor 46 may be connected to provide programmable functions as will be disclosed herein.

N-channel nano-crystal MOS transistor 42 may be fabricated using known charge-trapping nano-crystal processing techniques. Its gate may be coupled to a circuit to provide the proper voltages for programming and erasing the memory cell 40, and for using the memory cell 40 during normal circuit operation. The particular potentials used for these operations will vary as a function of the technology employed and the process geometry.

In all of the cells shown in FIGS. 1A through 1D, the volatile p-channel MOS transistor charges the common drain connection of the p-channel and n-channel transistors, and thus the gate of the switching transistor, to either 0V or about $V_{cc}$ depending on whether or not the non-volatile transistor is programmed. When the non-volatile transistor is turned on, it is preferable to bias the p-channel transistor for subthreshold conduction to limit current flow.

Persons of ordinary skill in the art will recognize that the devices used in the various embodiments of the present invention must be able to withstand the potentials that will be encountered during programming and erasing of the memory cells. The potentials used will of course depend on the type of non-volatile technology used as well as the device geometries.

Referring now to FIGS. 2A through 2D, schematic diagrams show several non-volatile memory cells according to the present invention in which a non-volatile MOS pullup transistor is used in conjunction with a volatile pulldown transistor. The combination of the non-volatile device and the volatile device are used to drive a switch.

Figure 2A:
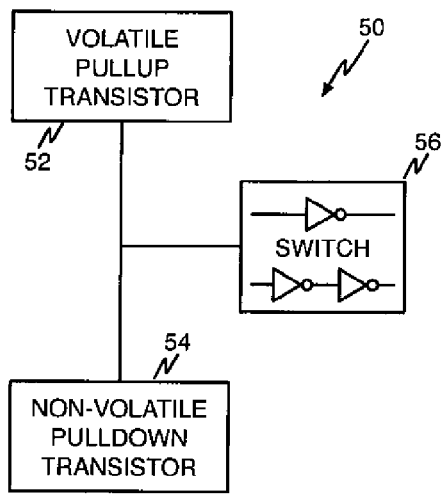
FIGS. 2A through 2D are schematic diagrams illustrating various non-volatile programmable memory cells using p-channel non-volatile MOS transistors, volatile n-channel MOS pulldown transistors and n-channel transistors as switches.

Referring now to FIG. 2A, memory cell 50 is shown. Reference numeral 52 represents a non-volatile pullup device, reference numeral 54 represents a volatile pulldown device. Reference numeral 56 represents a switch controlled by the devices 52 and 54 that may be used to control circuitry or selectively make interconnects. As presently contemplated, switch 56 may comprise a single transistor, an inverter, a buffer (two inverters in series) or other device. Switch 56 may even be itself the input of a multiplexer.

Figure 2B:
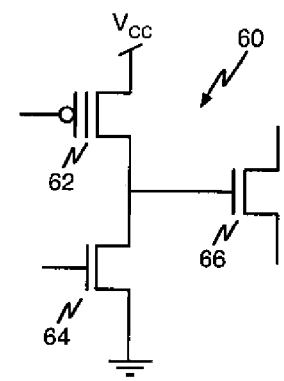

Referring now to FIG. 2B, memory cell 60 is shown. In normal operation, P-channel floating-gate MOS transistor 62 has its source coupled to $V_{cc}$ and its drain coupled to the drain of n-channel MOS pulldown transistor 64. The source of n-channel pulldown transistor 64 is coupled to the supply potential ground in normal operation. The common drain connection of transistors 62 and 64 is coupled to the gate of n-channel switch transistor 66. The source and drain of n-channel MOS switch transistor 66 may be connected to provide programmable functions as will be disclosed herein.

P-channel floating-gate MOS transistor 62 may be an EEPROM transistor or a flash transistor as is known in the art. Its gate may be coupled to a circuit to provide the proper voltages for programming and erasing the memory cell 60, and for using the memory cell 60 during normal circuit operation. The particular potentials used for these operations will vary as a function of the technology employed and the process geometry.

Figure 2C:
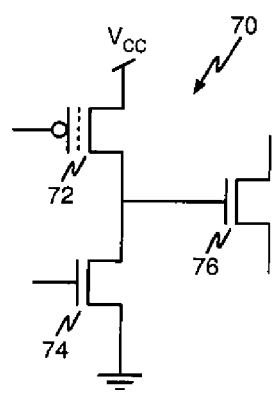

Referring now to FIG. 2C, memory cell 70 is shown. P-channel floating charge-trap MOS transistor 72 has its source coupled to $V_{cc}$ and its drain coupled to the drain of n-channel MOS pulldown transistor 74. The source of n-channel pulldown transistor 74 is coupled to the supply potential ground. The common drain connection of transistors 72 and 74 is coupled to the gate of n-channel switch transistor 76. The source and drain of n-channel MOS switch transistor 76 may be connected to provide programmable functions as will be disclosed herein.

P-channel floating charge-trap MOS transistor 72 may be fabricated using MNOS, SONOS, and other charge-trapping structures. Its gate may be coupled to a circuit to provide the proper voltages for programming and erasing the memory cell 70, and for using the memory cell 70 during normal circuit operation. The particular potentials used for these operations will vary as a function of the technology employed and the process geometry. As an example, where a high-voltage n-channel MOS pulldown transistor 74 is used, the following illustrative potentials may be encountered:

|  | N-Channel | | | | P-Channel | | | |
| --- | --- | --- | --- | --- | --- | --- | --- | --- |
|  | $V_G$ | $V_D$ | $V_S$ | $V_{p-well}$ | $V_G$ | $V_D$ | $V_S$ | $V_{n-well}$ |
| Program | 6 V | Float | 6 V | 2 V | −8 V | Float | +0 V | 6 V |
| Erase | 5 V | Float | 5 V | 5 V | −9 V | Float | +5 | 5 V |
| Normal Operation | .01 V | Float | 0 V | 0 V | 3.3 V | Float | +3.3 | 3.3 V |

Discrete charge trapping devices are less vulnerable to tunnel oxide defects than are floating gate devices and their use may be preferable because of this characteristic.

Figure 2D:
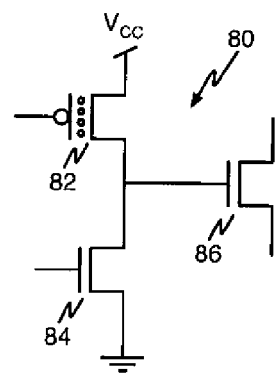

Referring now to FIG. 2D, memory cell 80 is shown. P-channel nano-crystal MOS transistor 82 has its source coupled to $V_{cc}$ and its drain coupled to the drain of n-channel MOS pulldown transistor 84. The source of n-channel pulldown transistor 84 is coupled to the supply potential ground. The common drain connection of transistors 82 and 84 is coupled to the gate of n-channel switch transistor 86. The source and drain of n-channel MOS switch transistor 86 may be connected to provide programmable functions as will be disclosed herein.

P-channel nano-crystal MOS transistor 82 may be fabricated using known nano-crystal processing techniques. Its gate may be coupled to a circuit to provide the proper voltages for programming and erasing the memory cell 80, and for using the memory cell 80 during normal circuit operation. The particular potentials used for these operations will vary as a function of the technology employed and the process geometry.

In all of the cells shown in FIGS. 2A through 2D, the volatile n-channel MOS transistor charges the common drain connection of the p-channel and n-channel transistors, and thus the gate of the switching transistor, to ground depending on whether or not the non-volatile transistor is programmed.

As with the embodiments of FIGS. 1A through 1D, persons of ordinary skill in the art will recognize that the devices used in the various embodiments of the present invention shown in FIGS. 2A through 2D must be able to withstand the potentials that will be encountered during programming and erasing of the memory cells. The potentials used will of course depend on the type of non-volatile technology used as well as the device geometries.

More particularly, in all of the embodiments shown in FIGS. 1A through 1D and 2A through 2D, the gate of the n-channel MOS switch transistor is coupled to the drain of either the n-channel MOS memory transistor (identified by reference numerals 12, 22, 32, and 42 of FIGS. 1A through 1D) or the p-channel MOS memory transistor (reference numerals 52, 62, 72, and 82 of FIGS. 2A through 2D, respectively). The gate oxide of the n-channel MOS switch transistor in each of the illustrated embodiments must be designed to be capable of withstanding the highest potential that it will possibly encounter during programming and erase operations.

In some embodiments, the non-volatile memory transistors are programmed using hot carrier injection programming, which is a current density dependent programming mechanism. For example, a nano-crystal device may require 100 microamps for every 0.18 microns of device width. A large programming current requires a larger volatile pullup (or pulldown) device. As memory cell sizes shrink, the cells have an increasingly limited $I_{pp}$. This may begin to become an issue for cells that use HCI (Hot Carrier electron Injection) for programming.

Figure 3:
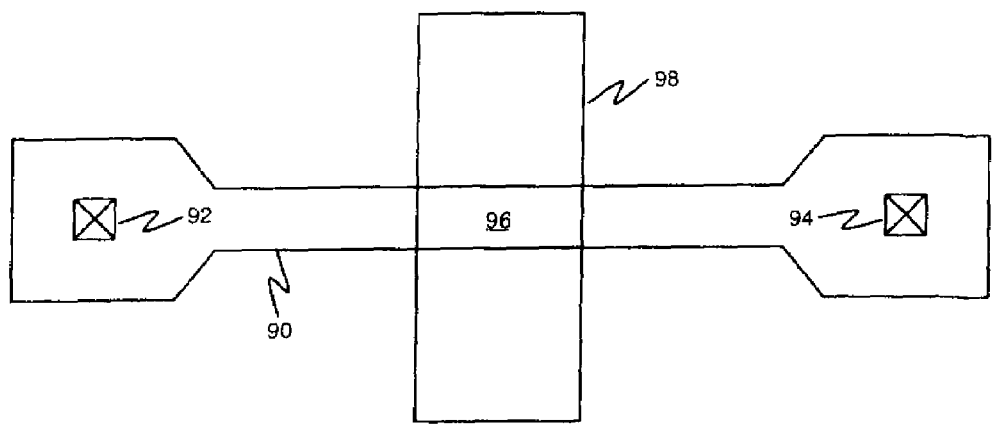
FIG. 3 is a top view of a portion of a layout diagram illustrating one technique for increasing the programming current in memory cells that are programmed using hot carrier injection programming.

Referring now to FIG. 3, a top view is shown of a portion of a layout diagram for a non-volatile transistor that may be used in the present invention employing a technique for increasing the programming current in memory cells that are programmed using hot carrier injection programming. In order to reduce the size of a non-volatile pull-up device for a programmable cell of the present invention, but maintain the required current density, the channel width of the non-volatile device may be reduced in a relevant area. According to this aspect of the present invention, the active channel area is narrowed down or "dogboned" from the non-volatile contact to a smaller width at the nano-crystal channel. Thus, as shown in FIG. 3, diffused region 90 is disposed between contacts 92 and 94. The channel region 96 disposed below gate 98 is narrowed down or "dogboned" to allow a greater current density during programming. In a typical nano-crystal transistor having a nominal channel width of about 0.2 microns, the width can be narrowed to about 0.12 microns to achieve the satisfactory current density increase for the purposes of the present invention.

Figure 4:
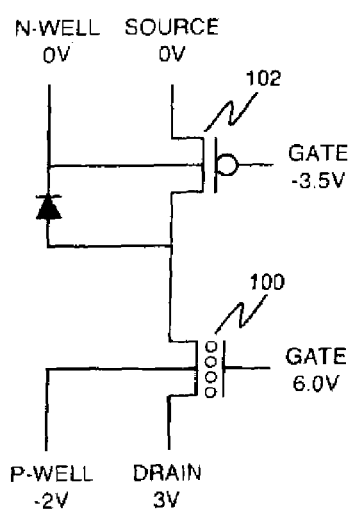
FIG. 4 is a schematic diagram illustrating another technique for increasing the programming current in memory cells that are programmed using hot carrier injection programming.

FIG. 4 is a schematic diagram illustrating a programmable cell according to the invention employing another technique for increasing the programming current in memory cells that are programmed using hot carrier injection programming. As shown in FIG. 4, nano-crystal n-channel MOS memory cell transistor 100 is connected in series with p-channel MOS pullup transistor 102. FIG. 4 shows illustrative bias-voltage conditions that may be used during programming of nano-crystal n-channel MOS memory cell transistor 100 in accordance with the present invention.

By tying the drain of the p-channel MOS pullup transistor 102 into the n-well in which it is formed, value of $I_{pp}$ can be further increased beyond just passing current through its channel. This aids in the HCI programming time and reduces the burden of increasing the bias on the p-channel MOS pullup transistor 102 or increasing its size in order to accommodate a higher $I_{pp}$.

In the memory cells disclosed herein, if a radiation particle strikes the node containing the gate of the n-channel MOS switch transistor, the node may be discharged from $V_{cc}$ to ground or to the bias of the substrate or p-well containing the device (which is normally ground). This causes the switch(es) to turn off. It will take the p-channel pullup transistor about 1–10 microseconds to charge this node back up to operating voltage, during which time the FPGA may not function correctly.

Figure 5:
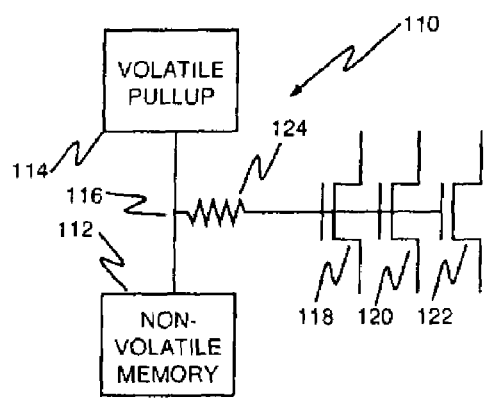
FIG. 5 is a schematic diagram illustrating a radiation-tolerant version of a memory cell according to the present invention.

FIG. 5 is a schematic diagram illustrating a radiation-tolerant version of a memory cell according to the present invention that avoids this problem. As in the memory cells disclosed with reference to FIGS. 1A through 1D, the radiation-tolerant memory cell 110 of FIG. 5 includes a non-volatile memory transistor 112 in series with a volatile pullup transistor 114. The common drain node 116 of the two transistors is seen driving the gates of three n-channel MOS switching transistors 118, 120, and 122 through resistor 124.

By adding a resistor 124 of proper value between common drain node 116 and the gate of the first switch 118 to which node 116 is connected, the RC time constant of the circuit may be modified so that the RC time constant is greater than the time it takes the volatile p-channel transistor to recharge node 116 (the recovery time of the cell) following a disruption (e.g., by energy from radiation or a charged particle). For example, if the recovery time is 1 microsecond and the gate capacitance is $1 \times 10^{-14}$ Farads, then the resistance needs to be greater than 100 MegaOhms ($R=T/C=10^{-6}/10^{-14}=10^{8}$). This type of resistor may be constructed of undoped or very lightly doped polysilicon, as well known in the art.

Persons of ordinary skill in the art will appreciate that the solution shown in FIG. 5 will work equally well with the memory cells shown in FIGS. 2A through 2D using p-channel non-volatile MOS memory transistors and n-channel pulldown transistors.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A two transitors non-volatile programmable memory cell comprising:
    a non-volatile MOS transistor of a first conductivity type directly connected between a first power supply potential and an output node, the non-volatile MOS transistor having a floating gate and a control gate;
    a volatile MOS transistor of a second conductivity type directly connected between the output node and a second power supply potential, the volatile MOS transistor having a control gate;
    a volatile switch directly connected to the output node;
    wherein the control gate of the non-volatile MOS transistor and the control gate of the volatile MOS transistor do not share a common connection; and wherein the volatile switch is directly connected to the output node through a resistor; and an RC time constant of the memory cell is greater than a recovery time of the memory cell.

2. The non-volatile programmable memory cell of claim 1 wherein the volatile switch is a volatile MOS transistor having a gate coupled to the output node.

3. The non-volatile programmable memory cell of claim 1 wherein the volatile switch is a plurality of volatile MOS transistors of the same conductivity type each having a gate coupled to the output node.

4. The non-volatile programmable memory cell of claim 1 wherein the volatile switch is an inverter having an input coupled to the output node.

5. The non-volatile programmable memory cell of claim 1 wherein the volatile switch is a buffer having an input coupled to the output node.

6. The non-volatile programmable memory cell of claim 1 wherein the non-volatile MOS transistor is a floating gate transistor.

7. The non-volatile programmable memory cell of claim 1 wherein the non-volatile MOS transistor is a flash transistor.

8. The non-volatile programmable memory cell of claim 1 wherein the non-volatile MOS transistor is a charge-trapping transistor.

9. The non-volatile programmable memory cell of claim 1 wherein the non-volatile MOS transistor is a nano-crystal transistor.

10. The non-volatile programmable memory cell of claim 1 wherein the first conductivity type is N and the second conductivity type is P.

11. The non-volatile programmable memory cell of claim 1 wherein the first conductivity type is P and the second conductivity type is N.

12. The non-volatile programmable memory cell of claim 1 wherein the first conductivity type is N, the second conductivity type is P, and the volatile MOS transistor is N type.

13. The non-volatile programmable memory cell of claim 1 wherein the first conductivity type is P, the second conductivity type is N, and the volatile MOS transistor is N type.

14. The non-volatile programmable memory cell of claim 1 wherein the non-volatile MOS transistor has an active channel area defined in an active region disposed between two contacts, the active region in the active channel area having a width narrower than the width of the active region at the two contacts.

15. The non-volatile programmable memory cell of claim 14 wherein the width of the active region in the active channel area is about 0.2 microns and the width at of the active region at the two contacts is about 0.2 microns.

16. A two transitors non-volatile programmable memory cell comprising:
    a non-volatile n-channel MOS transistor directly connected between a first power supply potential and an output node, the non-volatile n-channel MOS transistor having a floating gate and a control gate;
    a volatile p-channel MOS pullup transistor directly connected between the output node and a second power supply potential, the volatile p-channel MOS pullup transistor having a control gate;
    a volatile switch directly connected to the output node;
    wherein the control gate of the non-volatile n-channel MOS transistor and the control gate of the volatile p-channel MOS pullup transistor do not share a common connection; and wherein the volatile switch is directly connected to the output node through a resistor; and an RC time constant of the memory cell is greater than a recovery time of the memory cell.

17. The non-volatile programmable memory cell of claim 16 wherein the volatile switch is a volatile n-channel MOS transistor having a gate coupled to the output node.

18. The non-volatile programmable memory cell of claim 16 wherein the volatile switch is a plurality of volatile n-channel MOS transistors each having a gate coupled to the output node.

19. The non-volatile programmable memory cell of claim 16 wherein the volatile switch is an inverter having an input coupled to the output node.

20. The non-volatile programmable memory cell of claim 16 wherein the volatile switch is a buffer having an input coupled to the output node.

21. The non-volatile programmable memory cell of claim 16 wherein the non-volatile n-channel MOS transistor is a floating gate transistor.

22. The non-volatile programmable memory cell of claim 16 wherein the non-volatile n-channel MOS transistor is a flash transistor.

23. The non-volatile programmable memory cell of claim 16 wherein the non-volatile n-channel MOS transistor is a floating charge-trapping transistor.

24. The non-volatile programmable memory cell of claim 16 wherein the non-volatile n-channel MOS transistor is a nano-crystal transistor.

25. The non-volatile programmable memory cell of claim 16 wherein the non-volatile MOS transistor has an active channel area defined in an active region disposed between two contacts, the active region in the active channel area having a width narrower than the width of the active region at the two contacts.

26. The non-volatile programmable memory cell of claim 25 wherein the width of the active region in the active channel area is about 0.2 microns and the width at of the active region at the two contacts is about 0.2 microns.

27. A two transistors non-volatile programmable memory cell comprising:
   a non-volatile p-channel MOS transistor directly connected between a first power supply potential and an output node, the non-volatile p-channel MOS transistor having a floating gate and a control gate;
   a volatile n-channel MOS pulldown transistor directly connected between the output node and a second power supply potential, the volatile n-channel MOS pulldown transistor having a control gate;
   a volatile switch directly connected coupled to the output node;
   wherein the control gate of the non-volatile p-channel MOS transistor and the control gate of the volatile n-channel MOS pulldown transistor do not share a common connection; and wherein the volatile switch is directly connected to the output node through a resistor; and an RC time constant of the memory cell is greater than a recovery time of the memory cell.

28. The non-volatile programmable memory cell of claim 27 wherein the volatile switch is a volatile n-channel MOS transistor having a gate coupled to the output node.

29. The non-volatile programmable memory cell of claim 27 wherein the volatile switch is a plurality of volatile n-channel MOS transistors each having a gate coupled to the output node.

30. The non-volatile programmable memory cell of claim 27 wherein the volatile switch is an inverter having an input coupled to the output node.

31. The non-volatile programmable memory cell of claim 27 wherein the volatile switch is a buffer having an input coupled to the output node.

32. The non-volatile programmable memory cell of claim 27 wherein the non-volatile n-channel MOS transistor is a floating gate transistor.

33. The non-volatile programmable memory cell of claim 27 wherein the non-volatile n-channel MOS transistor is a flash transistor.

34. The non-volatile programmable memory cell of claim 27 wherein the non-volatile n-channel MOS transistor is a floating charge-trapping transistor.

35. The non-volatile programmable memory cell of claim 27 wherein the non-volatile n-channel MOS transistor is a nano-crystal transistor.

36. The non-volatile programmable memory cell of claim 27 wherein non-volatile MOS transistor has an active channel area defined in an active region disposed between two contacts, the active region in the active channel area having a width narrower than the width of the active region at the two contacts.

37. The non-volatile programmable memory cell of claim 36 wherein the width of the active region in the active channel area is about 0.2 microns and the width at of the active region at the two contacts is about 0.2 microns.

* * * * *